United States Patent
Blank et al.

(10) Patent No.: US 9,778,304 B2
(45) Date of Patent: Oct. 3, 2017

(54) CIRCUIT ASSEMBLY, METHOD FOR PRODUCING A TEST VOLTAGE, AND TESTING DEVICE FOR DETERMINING A LOSS FACTOR, WHICH TESTING DEVICE CONTAINS SAID CIRCUIT ASSEMBLY

(71) Applicant: B2 Electronic GmbH, Klaus (AT)

(72) Inventors: Rudolf Blank, Sulz (AT); Michael Furxer, Gofis (AT); Stefan Baldauf, Rankweil (AT)

(73) Assignee: B2 Electronic GmbH, Klaus (AT)

( * ) Notice: Subject to any disclaimer, the term of this patent is extended or adjusted under 35 U.S.C. 154(b) by 0 days.

(21) Appl. No.: 14/741,722

(22) Filed: Jun. 17, 2015

(65) Prior Publication Data

US 2015/0316596 A1 Nov. 5, 2015

Related U.S. Application Data

(63) Continuation of application No. PCT/EP2013/003762, filed on Dec. 13, 2013.

(30) Foreign Application Priority Data

Dec. 17, 2012 (DE) .......................... 10 2012 024 560

(51) Int. Cl.
*G01R 27/26* (2006.01)
*G01R 31/12* (2006.01)
(Continued)

(52) U.S. Cl.
CPC ...... *G01R 27/2694* (2013.01); *G01R 31/1272* (2013.01); *G01R 31/14* (2013.01);
(Continued)

(58) Field of Classification Search
CPC .......................... G01R 31/1272; G01R 31/14; G01R 27/2694; H02M 1/088; H02M 2001/007; H02M 2001/0077
(Continued)

(56) References Cited

U.S. PATENT DOCUMENTS

| 2006/0006741 A1 | 1/2006 | Tassitino, Jr. et al. |
| 2009/0073726 A1 | 3/2009 | Babcock |

(Continued)

FOREIGN PATENT DOCUMENTS

| DE | 3737373 A1 | 10/1988 |
| DE | 19513441 A1 | 10/1996 |

(Continued)

OTHER PUBLICATIONS

Zhiyu Cao et al., "Modeling and Control Design for a Very Low-Frequency High-Voltage Test System", IEEE Transactions on Power Electronics, IEEE Service Center, Piscataway, NJ, US, vol. 25, No. 4, Apr. 1, 2010, pp. 1068-1077, XP011296135, ISSN: 0885-8993, p. 1068, col. 2, paragraph II—p. 1070, paragraph IV; figures 1,2,3.

(Continued)

*Primary Examiner* — Christopher Mahoney
(74) *Attorney, Agent, or Firm* — Myers Wolin, LLC (57) ABSTRACT

A circuit assembly is provided for producing a test voltage for testing a test object, comprising two high voltage sources for producing a positive and negative high voltage of variable amplitude at respective outputs thereof and a high voltage switch assembly, which is arranged between the outputs of the two high voltage sources and the test object and which can be switched suitably in order to successively charge and discharge the test object, wherein furthermore a closed-loop controller is provided, which measures the present test voltage on the test object and acts on the high- (Continued)

voltage switch assembly in order to charge and discharge the test object in a defined manner in dependence on the measured test voltage.

10 Claims, 6 Drawing Sheets

(51) Int. Cl.
*G01R 31/14* (2006.01)
*H02M 1/088* (2006.01)
*H02M 3/335* (2006.01)
*H02M 1/00* (2006.01)

(52) U.S. Cl.
CPC ........ *H02M 1/088* (2013.01); *H02M 3/33561* (2013.01); *H02M 2001/007* (2013.01); *H02M 2001/0077* (2013.01)

(58) Field of Classification Search
USPC ........................................... 324/659
See application file for complete search history.

(56) References Cited

U.S. PATENT DOCUMENTS

| | | | |
|---|---|---|---|
| 2009/0175116 A1* | 7/2009 | Song | G11C 7/22 365/233.12 |
| 2016/0238648 A1* | 8/2016 | Stechemesser | G01R 31/021 |

FOREIGN PATENT DOCUMENTS

| | | |
|---|---|---|
| DE | 19519744 A1 | 12/1996 |
| DE | 19513441 C5 | 7/2008 |
| JP | S60219965 A | 11/1985 |
| JP | S6365383 A | 3/1988 |

OTHER PUBLICATIONS

International Search Report with written opinion, mailed on Apr. 16, 2014, for international application PCT/EP2013/003762.

Cable Manual (English translation of title), 8th Edition, Mario Kliesch and Dr. Frank Merschel, Ed. Rolf Rudiger, Cichowski, EW Medien und Kongresse GmbH.

U. Tietze, Ch. Schenk, Solid-State Circuit Engineering (English translation of title), 12th Edition, Chapter 12.3, Springer-Verlag.

Data sheet dated Mar. 15, 2013 and entitled "Baur High-Voltage Testing and Diagnostics Instrument—frida, frida TD" (English translation of title), Sulz, Austria, pp. 1-2 of Baur Prüf—und Messtechnik GmbH.

Mobile Testing and Diagnostics: frida with TD, PD-Portable, Sulz, Austria, pp. 1-37 of Baur Prüf—und Messtechnik.

S.J. Kearly, R.R. MacKinlay: "Discharge measurements in cables using a solid state 30 kV bipolar low frequency generator", Fifth International Conference on Dielectric Materials, Measurements and Applications, 1988, pp. 171-174.

* cited by examiner

CIRCUIT ASSEMBLY, METHOD FOR PRODUCING A TEST VOLTAGE, AND TESTING DEVICE FOR DETERMINING A LOSS FACTOR, WHICH TESTING DEVICE CONTAINS SAID CIRCUIT ASSEMBLY

CROSS REFERENCE TO RELATED APPLICATIONS

This application is a continuation under 35 U.S.C. §120 of International Application PCT/EP2013/003762, filed Dec. 13, 2013, which claims priority to German Application 10 2012 024 560.2, filed Dec. 17, 2012, the contents of each of which are incorporated by reference herein.

FIELD OF THE INVENTION

The present invention relates to a circuit arrangement for generating a test voltage for testing a test object comprising two high-voltage sources for generating a positive and a negative high voltage of variable amplitude at their respective outputs, a high-voltage switch arrangement, which is disposed between the outputs of the two high-voltage sources and the test object and which can be switched appropriately for successive charging and discharging of the test object, wherein a closed-loop controller is further provided that measures the instantaneous test voltage at the test object and, as a function of the measured test voltage, acts on the high-voltage switch arrangement for well-defined charging and discharging of the test object. Furthermore, the present invention relates to a test instrument, containing the circuit arrangement, for determining a loss factor, and to a method for generating a test voltage for testing a test object using such a circuit arrangement.

BACKGROUND

Such a circuit arrangement is known, for example, from DE 19513441 C5, wherein the two high-voltage sources therein are formed by two amplifier branches, which are respectively provided with a switched-mode power supply, a high-voltage transformer and a rectifier circuit. Each amplifier branch is connected on the input side to a (further) rectifier circuit, which generates a d.c. voltage from a line voltage. Such a circuit arrangement can be used, for example, for the purpose of measuring the loss factor of high-voltage and medium-voltage cables and other electrical components, wherein the loss factor ($\tan (\delta)$) of the test object is determined by supplying a test voltage that has a value in the kV range, is usually sinusoidal and varies at low frequency (preferably in the range of 0.01-0.1 Hz) at the test object in question, then determining and evaluating the phase position of the test voltage and the test current induced hereby. "Loss" in the present context refers to the energy that is lost electrically and electromagnetically in the test object and, for example, is converted to heat. The loss factor is a measure of this loss.

Hereinafter a capacitor connected to a voltage source with sinusoidal voltage variation is considered for more precise description of the principle underlying the loss-factor measurement. As is known, a phase shift $\phi$ between test voltage and the test current induced hereby and causing charging and discharging of the capacitor develops in such a capacitor. An ideal capacitor, which exhibits no losses of any kind, causes a phase shift between voltage and current of $\phi=90°$ for a sinusoidal test voltage. If losses now occur in the capacitor, the phase shift $\phi$ between voltage and current is no longer exactly 90° but instead differs from this ideal value by the loss angle $\delta=(90°-\phi)$. The loss factor to be determined for a test object during loss-factor measurement is now defined as $\tan (\delta)$, and it permits—in case of a deviation from the values to be realistically expected—an estimate of the degree of possible damage of the test object or as to whether the test object can still be used for the needed purpose.

For high-voltage and medium-voltage cables laid in the floor with XLPE insulation (XLPE=cross-linked polyethylene), which are also exposed, for example, to aging effects, such as the "water-tree" effect, for example, the common test criteria specify, for example, that their loss factor ($\tan \delta$) is not permitted to exceed a value of approximately $1*10^{-3}$ (see, for example, Cable Manual, 8th Edition, Mario Kliesch and Dr. Frank Merschel, Ed. Rolf Rüdiger Cichowski, E W Medien and Kongresse GmbH).

Test instruments with a measuring circuit for loss-factor measurement conventionally rely on suitable means for time-resolved measurement of the test voltage and test current as well as on a subsequent mathematical evaluation of the measured data obtained during measurement of the test voltage and test current, wherein the wavelength of test voltage and test current is first determined by means of a (discrete) Fourier transformation and then—using common and suitable approximation algorithms—the more or less exact phase position of current and voltage curves and from this the respective phase shift as well as the loss factor are determined. To achieve a measurement accuracy that is as high as possible or that meets the requirement for the specific application situation, it is of critical importance to determine the phase position of test voltage and test current as exactly as possible. If the capacitance of the test object is very low, the amplitude of the test current will also be correspondingly low, and therefore a test instrument designed to measure the loss factor will be subject to a restriction—depending on the capacitance of the test object and on the selected test-voltage amplitude—of the measurement range if the loss factor is to be determined with the specified measurement accuracy. This restriction of the measurement range is due to the fact that, at very low amplitudes of the test current, exact determination of its phase position with the necessary measurement accuracy is no longer possible.

By means of the test instruments known at present from the prior art, which are provided with a circuit arrangement of the type mentioned in the introduction together with integrated measuring and evaluating electronics for determining the loss factor, the loss factor ($\tan \delta$) of a test object can be determined—if the test object has a capacitance of greater than or equal to 15 nF—with a measurement accuracy of approximately $+/-1*10^{-4}$ by using conventional measuring voltages in the range of approximately 3 kV to 20 kV (rms voltage), whereas the loss factor can no longer be determined with the said accuracy if the capacitances are lower.

To generate the preferably sinusoidal test voltage of low frequency in the kV range, as is often also employed for VLF (very low frequency) cable testing, various approaches have already been suggested in the prior art.

In a first proposed variant for generation of a test voltage of low frequency (see S. J. Kearly, R. R. MacKinlay: "Discharge measurements in cables using a solid state 30 kV bipolar low frequency generator", Fifth International Conference on Dielectric Materials, Measurements and Applications, 1988, pp. 171-174), a voltage source is used to supply a d.c. voltage of +/−30 kV, with which the object to be tested is charged and discharged in well-defined manner by using a high-voltage switch arrangement functioning as a "controllable current source." Since a d.c. voltage on the order of magnitude of +/−30 kV is always present on the inputs of the high-voltage switch arrangement, which is formed as a cascade circuit and is subjected to closed-loop control as a function of the test voltage, the said circuit arrangement is associated with not inconsiderable electrical losses and corresponding heat development, and so it is impossible or hardly possible to use it in a testing and diagnostic instrument that is as compact as possible while containing integrated measuring and evaluation electronics for loss-factor measurement.

A further switch arrangement for generating a test voltage for the purpose of use relevant in the present case, as was already mentioned in the introduction, is known from DE 19513441 C5. Therein it was decided not to supply an unregulated d.c. voltage for the purpose of providing a circuit arrangement with improved efficiency and for generating test voltages of various and preprogrammed curve shapes. Instead, the test voltage is generated within the meaning of the class corresponding to the invention, by the fact that firstly a d.c. voltage (of variable amplitude) is generated from the line voltage by means of a rectifier circuit (to be connected to the external power network) after which it is transformed—in two amplifier branches functioning as high-voltage sources, each with a switched-mode power supply, a high-voltage transformer and a further rectifier circuit—respectively to a high voltage of variable amplitude, with which the test object can be charged and discharged in well-defined manner via an electronic high-voltage switch or a high-voltage switch arrangement subjected to closed-loop control as a function of the voltage at the test object. The first of these amplifier branches is used to supply a high voltage of positive sign at its output, whereas a high voltage of negative sign is generated at the output of the second amplifier branch.

Besides the features mentioned in the foregoing and also corresponding to the class of the present invention, it is further provided that, by means of the closed-loop controller acting on the high-voltage switch or on the high-voltage switch arrangement, an action is also exerted simultaneously, as a function of the (test) voltage measured at the test object by means of a voltage divider, on the two switched-mode power supplies, so that the high voltage functioning, as it were, as the envelope curve for the instantaneous test voltage at the outputs of the two amplifier branches (or high-voltage sources) is varied as a function of the test voltage for the purpose of minimizing the loss power and/or of establishing various desired curve shapes. With this circuit arrangement is was possible to reduce the loss power significantly compared with the prior art explained hereinabove, thus permitting the use of circuit arrangements of the class corresponding to the invention in compact test instruments with integrated loss-factor determination. As will be explained in even more detail hereinafter, however, and was first discovered within the scope of the present invention, the action on the switched-mode power supplies as provided according to DE 19513441 C5 generates undesired harmonics in the test voltage, and especially in the test current, thus imposing a limitation (which is distinct and, compared with the other interference sources of such an instrument is not inconsiderable) on the measurement accuracy in a test instrument designed for loss-factor measurement.

Further circuit arrangements and methods for generating a test voltage as well as test instruments equipped herewith are known from the undated company brochure entitled "Mobile Testing and Diagnostics: frida with TD, PD-Portable", Sulz, Austria, pp. 1-37 of Baur Prüf- and Messtechnik GmbH as well as from the data sheet dated 15 Mar. 2013 and entitled "Baur High-Voltage Testing and Diagnostics Instrument—frida, frida TD", Sulz, Austria, pp. 1-2 of Baur Prüf- and Messtechnik GmbH. Furthermore, the article of CAO, Zhiyu [et al.] entitled "Modeling and Control Design for a Very-Low-Frequency High-Voltage Test System", IEEE transactions on power electronics, Vol. 25, No. 4, April 2010, pp. 1068-1077 also describes a circuit arrangement of the class corresponding to the invention and a method for generating a VLF test voltage, wherein the test current to be generated therein is adjusted on the output side of the circuit arrangement under feedback control to the "frequency f" and the clock ratio ("duty cycle d") of a pulse generator, which in turn acts on the high-voltage sources ("power supply block") that generates the test voltage.

Against this background, the object of the present invention is to improve a circuit arrangement as well as a method for generating a test voltage of the type mentioned in the introduction to the effect that these are suitable for generating a test voltage that is as interference-free as possible and a test current that is as interference-free as possible and for use in a test instrument that is as compact as possible and capable of highly precise loss-factor measurement.

SUMMARY

This inventive circuit arrangement is characterized not only by the features mentioned in the introduction but also in that the closed-loop controller provided according to the invention does not act on the two high-voltage sources and that a separate open-loop controller is provided for the two high-voltage sources, wherein the said open-loop controller generates a clock signal independent of the voltage at the test object, so that a synchronized, predefined a.c. voltage uninfluenced by the closed-loop controller is supplied by the high-voltage sources.

In an advantageous configuration of the invention, it may then be provided that the two high-voltage sources are formed by two amplifier branches, which are provided respectively with a switched-mode power supply, a high-voltage transformer and a rectifier circuit, wherein each amplifier branch is connected on the input side to a rectifier circuit that generates a d.c. voltage from a line voltage.

In other words, it is therefore provided in the present invention that the voltage from the two high-voltage sources (or the voltage supplied by the switched-mode power supplies of the two amplifier branches and subsequently amplified) is subjected to open-loop control completely independently of the test voltage present on the test object. Instead of a closed-loop controller acting on the high-voltage sources or on switched-mode power supplies provided therein, a clock signal, which is generated by the open-loop controller and by means of which the two high-voltage sources can be supplied with a high voltage of variable amplitude that is synchronized on the basis of the clock signal and is exactly predefined (in its curve shape and phase position), is used for the most precise activation possible of the two high-voltage sources or switched-mode power supplies.

Within the scope of the present invention, it was noted that the closed-loop control actions on the switched-mode power supplies provided in the prior art cause undesired interferences (having the nature of harmonics in the frequency spectrum) in the a.c. voltage supplied by the respective switched-mode power supply and that these are subsequently amplified even more in the amplifier branch in question. As a result, undesired harmonic components develop in the test voltage, and in turn cause corresponding interferences in the form of noise in the test current. This noise in the test current impairs the accuracy necessary for highly precise loss-factor measurement during determination of the phase position of the test current, as is noticeable in particular in the measurement of loss factor on test objects with very low capacitances (and correspondingly low test currents).

In contrast, the development of the aforesaid harmonics in the test voltage and especially also in the test current can be avoided with the present invention, and so their phase position, in particular during generation of voltage and current curves that are as exactly sinusoidal as possible, and thus the loss factor also, can be determined with better measurement accuracy, as is noticeable in particular in test objects with low capacitance and correspondingly low test-current amplitudes.

In an improvement of the present invention, it is provided particularly expediently that the switched-mode power supplies are designed to generate a sinusoidal a.c. voltage, wherein the phase angle of the sinusoidal a.c. voltage is predetermined by the clock signal. Thus the positive or negative half wave of an a.c. voltage that is particularly exactly sinusoidal can then be supplied at the respective output of the two amplifier branches.

Furthermore, it can then be provided in a preferred improvement of the invention that (by suitable configuration or programming of the closed-loop controller) the test voltage and the test current derived therefrom, with which the well-defined charging and discharging of the test object take place, are also sinusoidal and, particularly preferably, are respectively almost free of harmonics. In subsequent evaluation of measured data (e.g. during determination of the loss factor of a test object), this permits particularly exact determination of the respective phase position of test voltage and test current and therefore ultimately increases the measurement accuracy of measuring and evaluation electronics, connected downstream from the inventive circuit arrangement, for determination of the loss factor of a test object.

The harmonics component relative to the fundamental wave can be expressed mathematically in the form of "total harmonic distortion", which represents the ratio of the sum of the squares of the rms amplitudes of all harmonics to the square of the (rms) amplitude of the fundamental oscillation. Systematic measurements of the harmonics component of the test voltages and test currents that can be achieved according to the invention have shown that almost harmonics-free test voltages with THD values smaller than or equal to 0.1% and almost harmonics-free test currents with THD values smaller than or equal to 5% can be achieved by using an inventive circuit arrangement. Compared with the circuit arrangement known from the prior art, with closed-loop control actions on the switched-mode power supplies as provided therein, the harmonics component in the test voltage—given otherwise identical instruments—can be reduced almost to one tenth (i.e. improved by a factor of 10) and the harmonics component in the test current can be almost halved.

Against this background the present invention relates not only to a circuit arrangement of the type described in the foregoing, but also, and advantageously, to a test instrument that contains an inventive circuit arrangement, a port for the line voltage and a port for the test object, wherein the inventive test instrument is further characterized in that it is provided with integrated measuring and evaluation electronics for determining the loss factor (known as tan delta measurement).

The generation of the test voltage achieved by means of an inventive circuit arrangement without closed-loop control action on the switched-mode power supplies not only increases the measurement accuracy of such a test instrument compared with the prior art but at the same time also expands the measurement range that can be covered with specified measurement accuracy.

Whereas the circuit arrangements known from the prior art (with closed-loop control of the two switched-mode power supplies) for installation in compact test instruments of the type described in the foregoing usually achieve a measurement accuracy of $+/-1*10^{-4}$ in the determination of loss factor only for capacitive loads greater than or equal to 10-15 nF, the measurement range of an otherwise identical test instrument according to the present invention can be expanded to the effect that the same measurement accuracy can be achieved for capacitances of greater than or equal to 2 nF or even of greater than or equal to 1 nF, specifically over a (conventional) test-voltage range of 3 kV to 20 kV.

This is therefore of importance in particular since the medium-voltage or high-voltage cables that are typically measured with inventive circuit arrangements have capacitances of approximately 0.2 nF per meter of cable length. Thus high-voltage cables with a length of approximately 10 meters and up can already be measured with an inventive test instrument, whereas only cables with a minimum length of 50 meters and up were measurable with the necessary accuracy by using a circuit arrangement known from the prior art.

At this place it must be mentioned that corresponding or even better measuring accuracies in connection with loss-factor measurement are already achievable with other types of test instruments, although these always use a (VLF) test-voltage generator and an external, additional measuring instrument for determination of the loss factor with means integrated therein for highly precise measurement of the test current and of the test voltage.

In an inventive test instrument with inventive circuit arrangement and integrated measuring and evaluation electronics for loss-factor measurement, however, the current to be measured must—in contrast to external measuring instruments for determining the loss factor—be routed via a protective ground connection or via a guard connection, i.e., an electronically generated protective ground potential on an additional measuring line, which compared with loss-factor-measuring instruments separated from the test-voltage source unavoidably leads to interferences or harmonics that are not present therein in the test current, which in the prior art this occurred in addition to the interferences generated by the closed-loop action on the switched-mode power supplies and impaired the measurement accuracy thereof in the already explained sense.

By using the inventive circuit arrangement in a test instrument with integrated tan delta measurement, the measurement accuracy explained in the foregoing can now be achieved for the first time in such test instruments.

And, finally, the present invention also relates to a method for generating a test voltage for testing a test object, comprising the following steps:
(A) Generating a first high voltage with positive sign and variable amplitude at the output of a first high-voltage source and a second high voltage with negative sign and variable amplitude at the output of a second high-voltage source (B) Successively charging and discharging the test object by appropriate switching of a high-voltage switch arrangement disposed between the outputs of the high-voltage sources and the test object, wherein a closed-loop controller is provided that measures the voltage at the test object and, as a function of the measured voltage, acts on the high-voltage switch arrangement for well-defined charging and discharging of the test object.

For this purpose it is provided according to the invention that the closed-loop controller does not act on the two high-voltage sources and that a separate open-loop controller acts on the two high-voltage sources, wherein the open-loop controller generates a clock signal independent of the voltage at the test object, so that a synchronized, predefined high voltage uninfluenced by the closed-loop controller is supplied by the high-voltage sources.

For the inventive method, which in the scope of the invention can be further advantageously supplemented by yet another method step for determination of the loss factor (in the manner described hereinabove) of the test object, obviously the same advantages and preferred configurations as already described in connection with the inventive circuit arrangement and the inventive test instrument are valid, and to this extent they are incorporated by reference to the foregoing explanations.

BRIEF DESCRIPTION OF THE DRAWINGS

Various exemplary embodiments of the present invention will be explained in more detail hereinafter on the basis of the drawing, wherein.

DETAILED DESCRIPTION OF THE PREFERRED EMBODIMENTS

Figure 1:
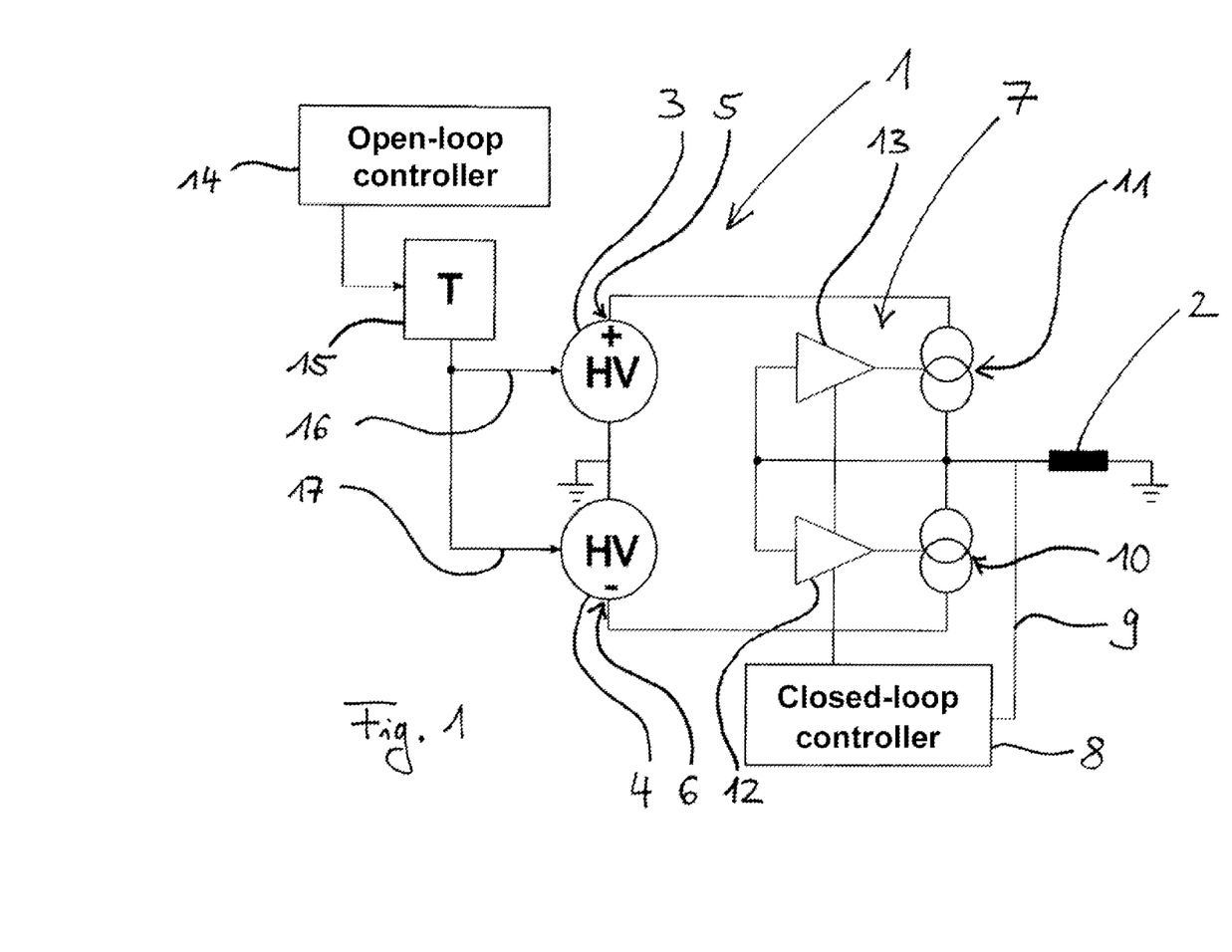
FIG. 1 shows a sketched circuit diagram of a first exemplary embodiment of an inventive circuit arrangement.

The sketched circuit diagram illustrated in FIG. 1 shows a first exemplary embodiment of an inventive circuit arrangement 1 for generating a test voltage for testing a test object 2, in this case a schematically illustrated high-voltage or medium-voltage cable, to be connected to circuit arrangement 1. Circuit arrangement 1 comprises two high-voltage sources 3, 4, which are designed to supply a positive (+) or negative (−) high voltage of variable amplitude at their respective outputs 5, 6. A high-voltage switch arrangement 7, on which a closed-loop controller 8 acts for well-defined charging and discharging of test object 2, representing a certain capacitive load, is provided between outputs 5, 6 of the two high-voltage sources 3, 4 and test object 2 to be connected to circuit arrangement 1. Closed-loop controller 8 is connected via line 9 to the voltage potential present at test object 2 and is designed to measure the test voltage present there, in order to take it into consideration in the context of closed-loop control of the voltage variation—preferably sinusoidal—that is desired and is to be imposed by closed-loop controller 8. Obviously the test voltage can lie only within the voltage ranges predetermined by the two high-voltage sources 3, 4, wherein the high voltage of advantageously sinusoidal shape predetermined by the two high-voltage sources 3, 4 is preferably always somewhat higher than the test voltage tapped therefrom via high-voltage switch arrangement 7, in order to leave some margin for compensation for load fluctuations—caused, for example, by closed-loop control actions.

In the present case, high-voltage switch arrangement 7 comprises two solid-state switch cascades 10, 11, for example, which as indicated by the selected circuit symbols function as voltage-controlled current sources and are in feedback relationship via respective amplifiers 12, 13, on which closed-loop controller 8 acts, as also explained in more detail in the publication already cited hereinabove (S. J. Kearly, R. R. MacKinlay: "Discharge measurements in cables using a solid state 30 kV bipolar low frequency generator", Fifth International Conference on Dielectric Materials, Measurements and Applications, 1988, pp. 171-174). Such solid-state switch arrangements (e.g. on a transistor or FET basis) functioning as (voltage-)controlled current sources are sufficiently known from the prior art (see, for example, U. Tietze, Ch. Schenk, Solid-State Circuit Engineering, 12th Edition, Chapter 12.3, Springer-Verlag).

The two high-voltage sources 3, 4 are activated not by closed-loop controller 8 but by a separate open-loop controller 14, wherein open-loop controller 14 comprises a clock-signal generator 15 which, via lines 16, 17 supplies to the two high-voltage sources 3, 4 subjected to open-loop control a clock signal T, which is taken into consideration in the generation of high voltage in such a way that the two high-voltage sources 3, 4 can respectively supply a high voltage that is synchronized on the basis of clock signal T, can have a predefined curve shape and amplitude, is advantageously edge-free and in particular is sinusoidal, and is not influenced by closed-loop controller 8.

Clock generator 15 needed for this purpose can be constructed, for example, digitally on a quartz-crystal basis or mechanically in the manner of stepping motor, and should be designed to generate a sufficiently precise clock signal T, e.g. with repetition rates in the μs range.

Figure 2:
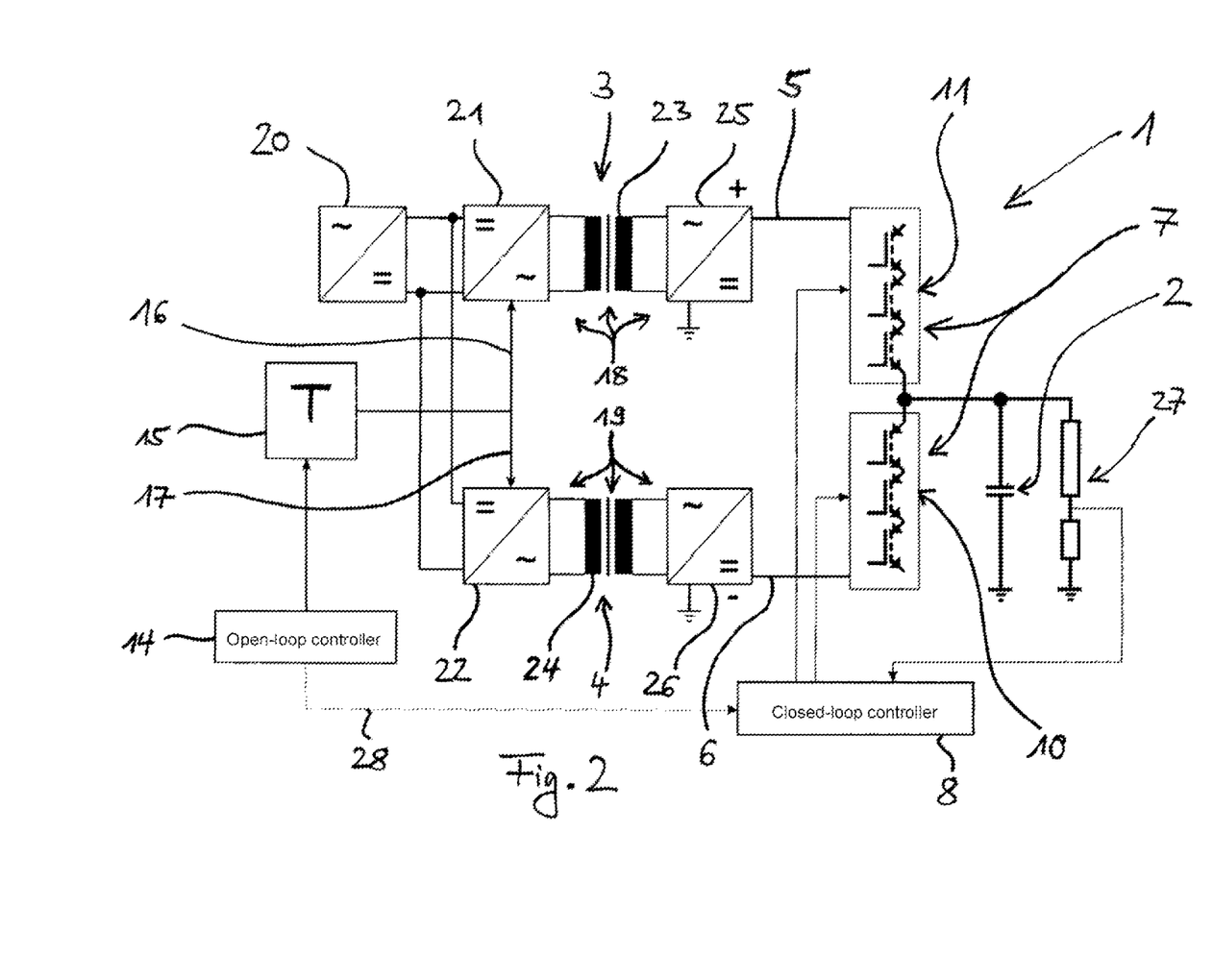
FIG. 2 shows a sketched circuit diagram of a second exemplary embodiment of an inventive circuit arrangement.

FIG. 2 shows a second exemplary embodiment of an inventive circuit arrangement for generating a test voltage for testing a test object 2 with capacitive properties to be connected to circuit arrangement 1, wherein, for the purpose of simplified explanation, components of the circuit arrangement of FIG. 2 functionally or structurally equivalent to those of the circuit arrangement of FIG. 1 are denoted by like reference symbols, and so the foregoing explanations are incorporated by reference for the description thereof.

The special nature of the circuit arrangement of FIG. 2 lies in the fact that the two high-voltage sources 3, 4 here are each formed by an amplifier branch 18, 19, wherein each amplifier branch 18, 19 is connected on the input side to a rectifier circuit 20, which generates a d.c. voltage (of variable amplitude) from a line voltage. Each amplifier branch 18, 19 comprises a switched-mode power supply 21, 22 (disposed on the input side) for generating a predetermined, especially sinusoidal a.c. voltage, a high-voltage transformer 23, 24 for amplifying the a.c. voltage generated by the respective switched-mode power supply 21, 22 and a rectifier circuit 23, 24 (disposed on the output side), by means of which it is ensured that a high voltage of positive sign is always supplied to output 5 of first amplifier branch 18 and a high voltage of negative sign is always supplied to output 6 of second amplifier branch 19.

The sketched circuit diagram of the second exemplary embodiment of an inventive circuit arrangement 1 according to FIG. 2 shows further that high-voltage switch arrangement 7 disposed between outputs 5, 6 of the two amplifier branches 18, 19 functioning as high-voltage sources 3, 4 and test object 2 can be configured as two solid-state switch cascades 10, 11, on which closed-loop controller 8 acts appropriately. Furthermore, in the exemplary embodiment of FIG. 2, the test voltage present at test object 2 and measured by closed-loop controller 8 by means of a suitable measuring device is tapped via a voltage divider 27.

And, finally, it is indicated by dotted arrow 28 in the exemplary embodiment according to FIG. 2 that information can also be communicated if necessary by open-loop controller 14 (e.g. via clock signal T generated by open-loop controller 14 or clock-signal generator 15) to closed-loop controller 8 (but not vice versa), so that it can be taken into consideration if necessary for the action on high-voltage switch arrangement 7.

Since the high voltage generated in the two high-voltage sources 3, 4 or by means of switched-mode power supplies 21, 22 with subsequent high-voltage amplification is subjected in the present case to open-loop control of its variation in time by open-loop controller 14 and clock signal T generated thereby, and since the generation of high voltage takes place without other closed-loop control actions, a particularly "smooth", i.e. edge free (and advantageously sinusoidal) variation of the respective voltage profile can be generated in particular with high-voltage sources 3, 4 of inventive circuit arrangement 1.

Figure 3A:
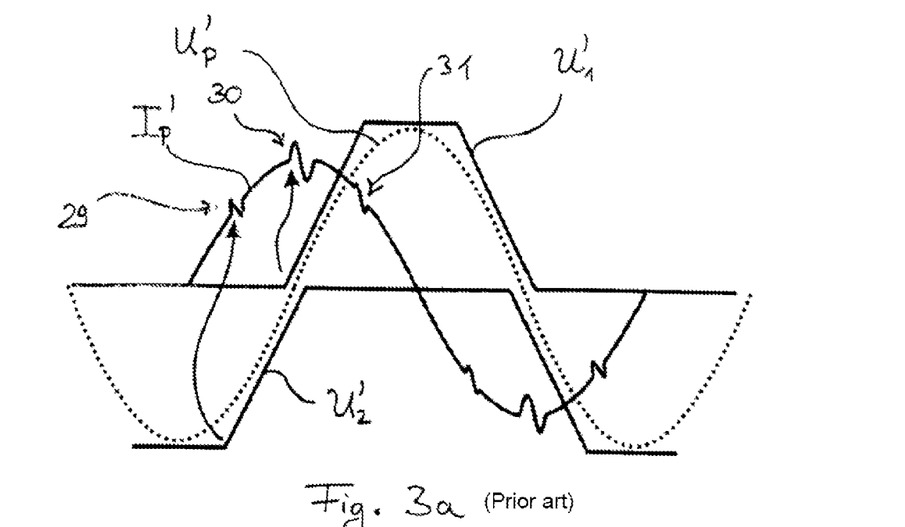
FIGS. 3a and 3b show a schematic diagram of the generation of test voltage and test current according to the prior art and the present invention.
Figure 3B:
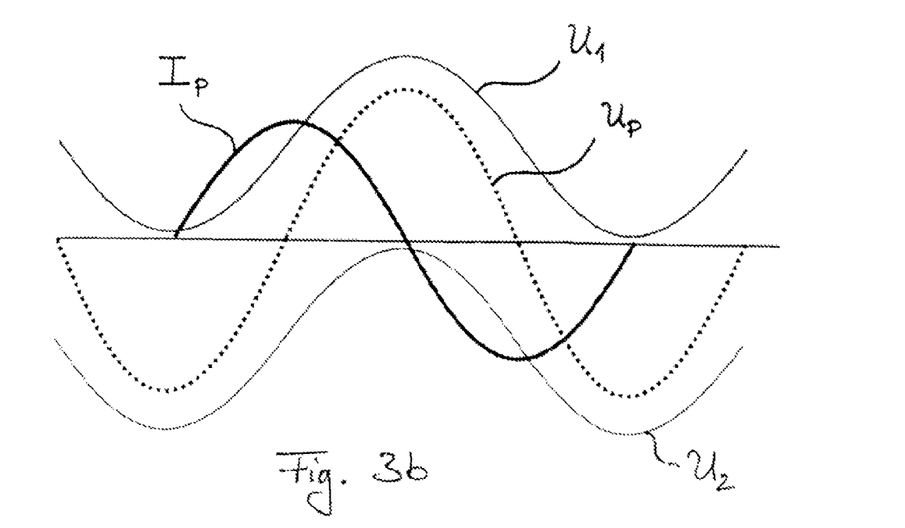

The schematic voltage and current curves of FIGS. 3a and 3b illustrate the effect that can be achieved with the present invention.

The schematic diagram of FIG. 3a illustrates the voltage and current variations generated with a circuit arrangement known from the prior art, with closed-loop control actions on the high-voltage sources, wherein the high voltages $U_1'$, $U_2'$ supplied at the output of two amplifier branches are characterized by a voltage variation having edges with closed-loop control actions. From these two high voltages $U_1'$, $U_2'$, which as it were form an envelope curve for test voltage $U_P'$, a largely sinusoidal variation of test voltage $U_P'$ can be generated by means of suitable closed-loop control of the solid-state switch arrangement on the high-voltage side. However, the edges present in the voltage envelope curve and the associated load fluctuation in the circuit arrangement cause, as illustrated schematically in FIG. 3a, interferences 29, 30, 31 in the manner of harmonics or noise in the ideally sinusoidal test current $I_P'$, just as do other closed-loop control actions on the high-voltage sources, ultimately having a detrimental influence on the accuracy of a determination of the exact phase position of test current $I_P'$ that may be necessary in a later measuring process, especially at very low current amplitudes.

In contrast, it is possible within the scope of the present invention, by using an inventive circuit arrangement, as is schematically illustrated in FIG. 3b, to generate sinusoidal and edge-free high voltages $U_1$, $U_2$ particularly exactly by means of the two high-voltage sources synchronized by a clock signal of the open-loop controller and not affected by closed-loop control actions, and from these to generate, by means of the high-voltage switch arrangement, a test voltage $U_P$ that is also particularly exactly sinusoidal and almost harmonics-free and—derived therefrom—an almost harmonics-free test current $I_P$, thus significantly increasing the measurement accuracy of a measuring instrument provided with such a circuit arrangement and integrated loss-factor measurement, as has already been explained hereinabove.

Figure 4A:
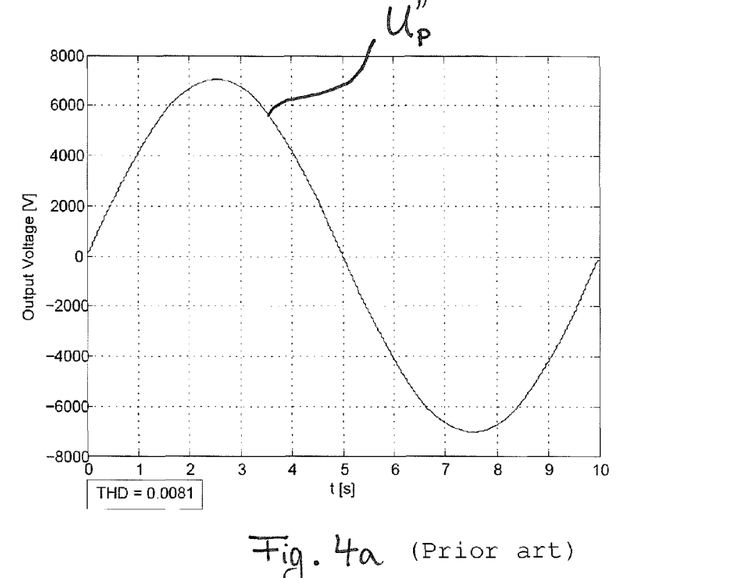
FIGS. 4a and 4b show measured results of the variation of the test voltage and test current using a circuit arrangement known from the prior art.
Figure 4B:
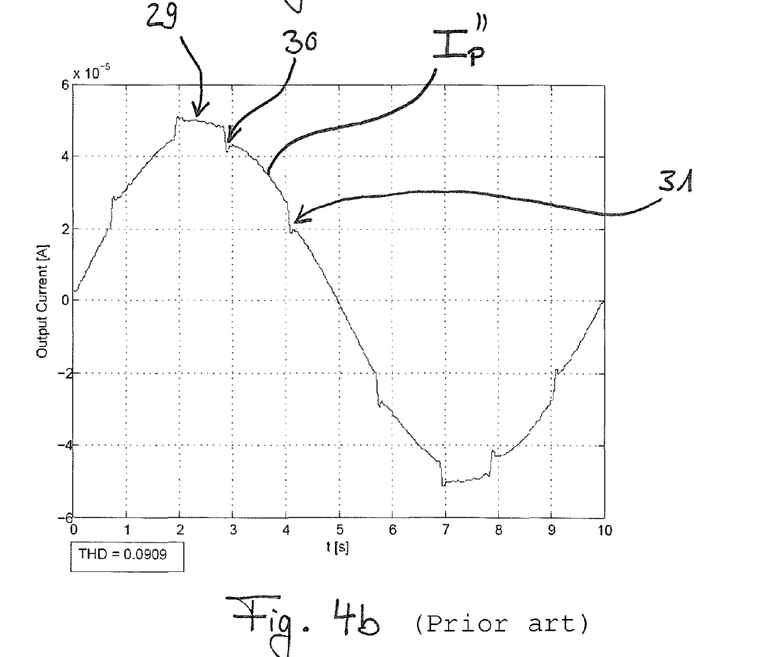
Figure 5A:
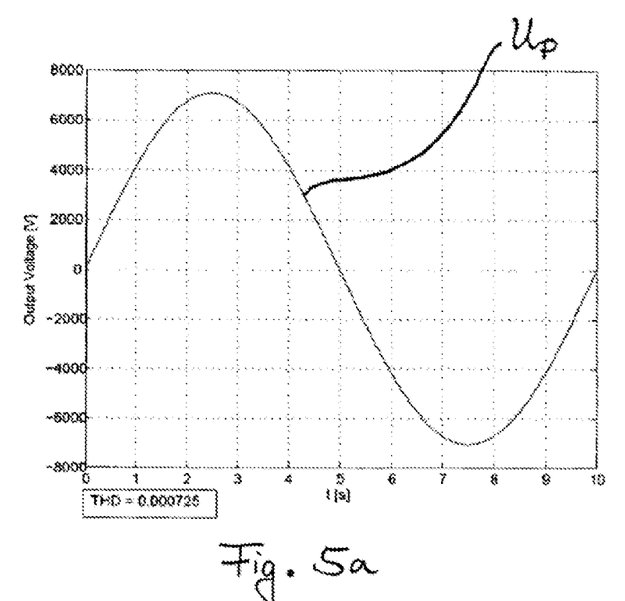
FIGS. 5a and 5b show measured results of the variation of the test voltage and test current using an inventive circuit arrangement.
Figure 5B:
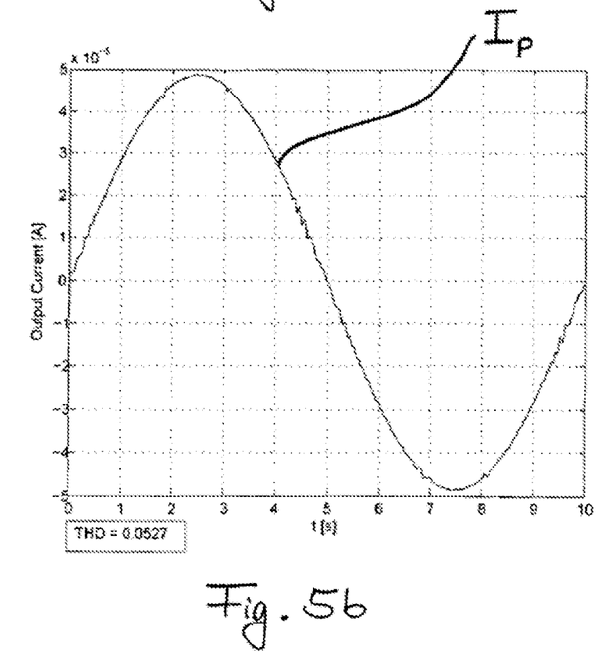

Finally, FIGS. 4a, 4b and 5a, 5b show real measured results for comparison measurements of the test voltage and test current in an experimental arrangement, in which—with instruments of otherwise absolutely identical design—a circuit arrangement known from the prior art, with feedback control of the switched-mode power supplies of the two amplifier branches was used at first (see FIGS. 4a and 4b) and then an inventive circuit arrangement according to FIG. 2 was used (see FIGS. 5a and 5b).

The plot of test voltage $U_P''$, illustrated in FIG. 4a, which was obtained with a circuit arrangement known from the prior art, shows a sinusoidal variation with hardly perceptible harmonics, wherein the THD value (total harmonic distortion), representing the harmonics component, is 0.0081. In contrast, in the variation of test current $I_P''$ generated therefrom and illustrated in FIG. 4b, a large number of interferences 29, 30, 31 are apparent, caused by closed-loop control actions on the high-voltage sources and an edge-containing variation of the voltage amplitude at the output of the two high-voltage sources, and leading to a THD value of 0.0909 for test current $I_P''$.

In contrast, the plots of test voltage $U_P$ and test current $I_P$ achieved with an inventive circuit arrangement, in which the THD values are 0.000725 for test voltage $U_P$ (see FIGS. 5a) and 0.0527 for test current $I_P$, respectively exhibit—compared with the prior art—an almost harmonics-free variation, thus significantly improving the measurement accuracy of a measuring instrument equipped with an inventive circuit arrangement.

Figure 6:
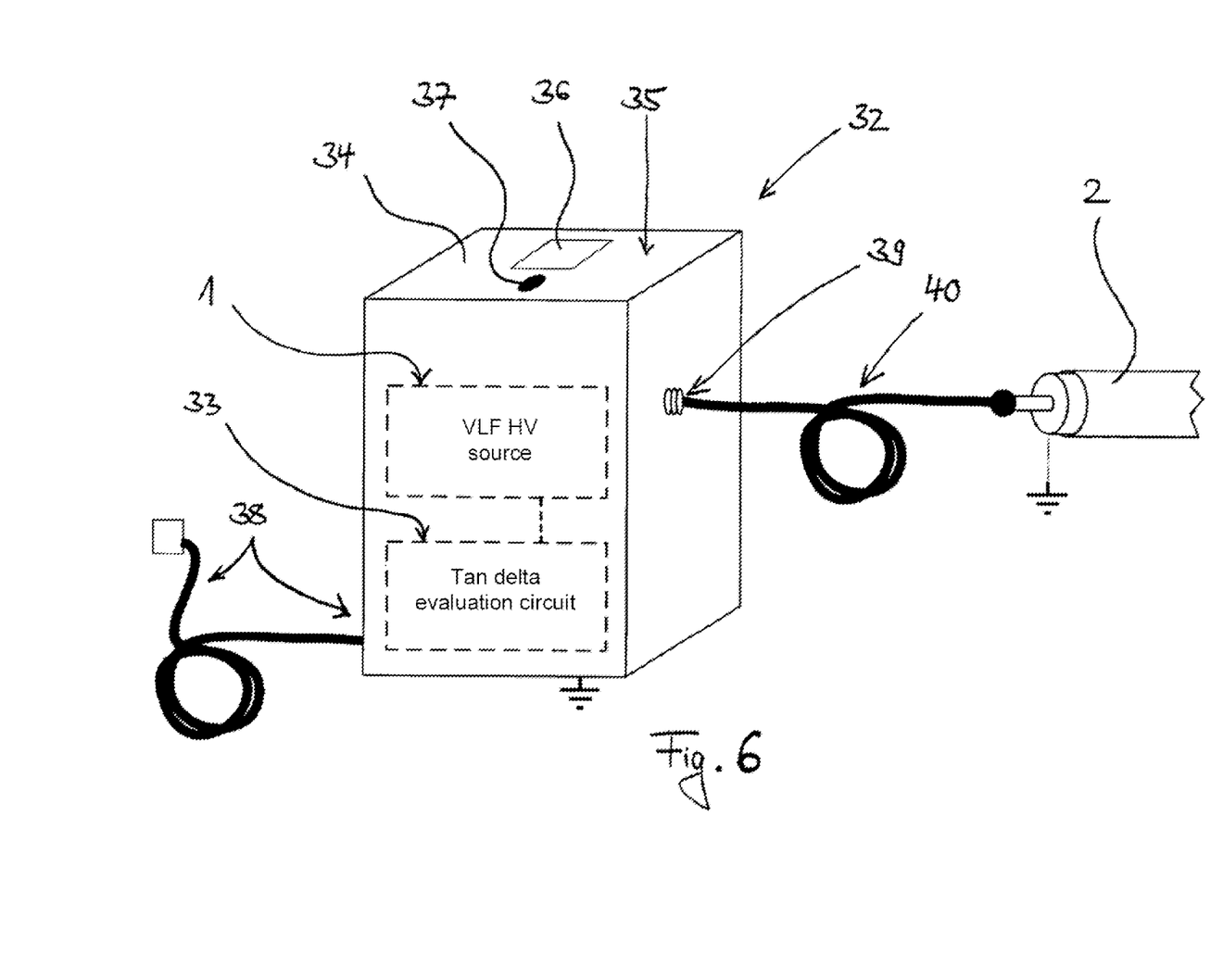
FIG. 6 shows a schematic view of an exemplary embodiment of an inventive test instrument.

Finally, FIG. 6 shows an inventive test instrument 32 which, as schematically illustrated, is provided with an inventive circuit arrangement 1 ("VLF HV source") for generating a suitable (VLF) test voltage and measuring and evaluation electronics 33 (tan delta evaluation circuit) coupled herewith and integrated into the test instrument for determination of the loss factor of test object 2 to be tested, which in the present case is a high-voltage or medium-voltage cable 2.

In this case both circuit arrangement 1 and measuring/evaluation electronics 33 are disposed inside housing 34 of test instrument 32, on top side 35 of which at least one display/indicating element 36 is provided for display of the obtained test data, as is at least one operator-control element 37 for setting the measurement parameters, as is schematically indicated.

The instrument is further provided with a port 38 for the line voltage and a port 39 for the test object 2 to be connected—in the present case via a high-voltage cable 40.

What is claimed is:

1. A circuit arrangement (1) for generating a test voltage (Up) for testing a test object (2) comprising:
    two high-voltage sources (3, 4) for generating a positive and a negative high voltage ($U_1$, $U_2$) of variable amplitude at their respective outputs (5, 6),
    a high-voltage switch arrangement (7), which is disposed between the outputs (5, 6) of the two high-voltage sources (3, 4) and the test object (2) and which can be switched appropriately for successive charging and discharging of the test object (2),
        wherein a closed-loop controller (8) is further provided that measures the instantaneous test voltage ($U_P$) at the test object (2) and, as a function of the measured test voltage ($U_P$), acts on the high-voltage switch arrangement (7) for well-defined charging and discharging of the test object (2), wherein the closed-loop controller (8) does not act on the two high-voltage sources (3, 4) and a separate open-loop controller (14) is provided for the two high-voltage sources (3, 4), wherein the open-loop controller (14) generates a clock signal (T) independent of the voltage ($U_P$) at the test object (2), so that a synchronized, predefined high voltage ($U_1$, $U_2$) uninfluenced by the closed-loop controller (8) is supplied by the high-voltage sources (3, 4), and wherein the high-voltage switch arrangements (7) comprises two solid-state switch cascades (10, 11) which functions as voltage-controlled current sources.

2. The circuit arrangement of claim 1, wherein the two high-voltage sources (3, 4) are formed by two amplifier branches (18; 19), which are each provided with a switched-mode power supply (21; 22), a high-voltage transformer (23; 24) and a rectifier circuit (25; 26), wherein each amplifier branch (18; 19) is connected on the input side to a rectifier circuit (20) that generates a d.c. voltage from a line voltage.

3. The circuit arrangement of claim 2, wherein the switched-mode power supplies (21, 22) are designed to generate a sinusoidal a.c. voltage, wherein the phase angle of the sinusoidal a.c. voltage is predetermined by the clock signal (T).

4. The circuit arrangement of claim 3, wherein the test voltage ($U_P$) and a test current ($I_P$) derived therefrom, with which the well-defined charging and discharging of the test object (2) take place, are sinusoidal.

5. The circuit arrangement of claim 4, wherein the test voltage ($U_P$), with a total harmonic distortion (THD) of smaller than or equal to 0.1%, is almost harmonics-free.

6. The circuit arrangement of claim 4, wherein the test current ($I_P$), with a total harmonic distortion (THD) of smaller than or equal to 5%, is almost harmonics-free.

7. A test instrument (32) that comprises the circuit arrangement (1) of claim 1, a port (38) for the line voltage and a port (39) for the test object (2), wherein the test instrument (32) is provided with integrated measuring and evaluation electronics (33) for determining the loss factor of the test object (2).

8. The test instrument of claim 7, wherein the test instrument (32) for determination of loss factor has a measurement accuracy of +/−1 * $10^{-4}$, and specifically for a capacitance of the test instrument of only 2 nF and over a test-voltage range of 3 kV to 20 kV.

9. The test instrument of claim 7, wherein a test current ($I_P$) measured in the measuring and evaluation electronics (32) is routed via a protective ground connection or via a guard connection.

10. A method for generating a test voltage ($U_P$) for testing a test object (2), comprising:
(A) Generating a first high voltage ($U_1$) with positive sign and variable amplitude at the output of a first high-voltage source (3) and a second high voltage ($U_2$) with negative sign and variable amplitude at the output of a second high-voltage source (4), and
(B) Successively charging and discharging the test object (2) by appropriate switching of a high-voltage switch arrangement (7) disposed between the outputs (5, 6) of the high-voltage sources (3, 4) and the test object (2), wherein a closed-loop controller (8) is provided that measures the voltage ($U_P$) at the test object (2) and, as a function of the measured voltage ($U_P$), acts on the high-voltage switch arrangement (7) for well-defined charging and discharging of the test object (2), wherein the closed-loop controller (8) does not act on the two high-voltage sources (3, 4) and that a separate open-loop controller (14) acts on the two high-voltage sources (3, 4), wherein the open-loop controller (14) generates a clock signal (T) independent of the voltage ($U_P$) at the test object (2), so that a synchronized, predefined high voltage ($U_1$, $U_2$) uninfluenced by the closed-loop controller (8) is supplied by the two high-voltage sources (3, 4), and wherein the high-voltage switch arrangement (7) comprises two solid-state switch cascades (10, 11) which function as voltage-controlled current sources.

* * * * *